United States Patent
Pearson

Patent Number: 6,132,576
Date of Patent: Oct. 17, 2000

[54] VACUUM SPUTTERING APPARATUS

[75] Inventor: David Ian Pearson, Havant, United Kingdom

[73] Assignee: Nordiko Limited, United Kingdom

[21] Appl. No.: 09/462,318

[22] PCT Filed: Sep. 3, 1998

[86] PCT No.: PCT/GB98/02642

§ 371 Date: Jan. 5, 2000

§ 102(e) Date: Jan. 5, 2000

[87] PCT Pub. No.: WO99/13491

PCT Pub. Date: Mar. 18, 1999

[30] Foreign Application Priority Data

Sep. 5, 1997 [GB] United Kingdom .................... 9718947

[51] Int. Cl.[7] .................................................. C23C 14/35
[52] U.S. Cl. .............................. 204/298.2; 204/298.06; 204/298.17; 204/298.19; 335/209; 335/296; 335/302; 335/306
[58] Field of Search .................... 204/298.06, 298.17, 204/298.19, 298.2; 335/209, 212, 296, 302, 306

[56] References Cited

U.S. PATENT DOCUMENTS

| | | | |
|---|---|---|---|
| 4,631,106 | 12/1986 | Nakazato et al. | 204/298.2 |
| 4,746,417 | 5/1988 | Ferenbach et al. | 204/298.2 |
| 5,262,030 | 11/1993 | Potter | 204/298.2 |

FOREIGN PATENT DOCUMENTS

| | | |
|---|---|---|
| 0606097A1 | 7/1994 | European Pat. Off. . |
| 55-111852 | 8/1980 | Japan . |
| 10-121236 | 5/1998 | Japan . |
| WO97/03220 | 1/1997 | WIPO . |

*Primary Examiner*—Rodney McDonald
*Attorney, Agent, or Firm*—Senniger, Powers, Leavitt & Roedel

[57] ABSTRACT

A vacuum sputtering apparatus (1) is described in which a target (7) having a target face (8) is mounted in a vacuum chamber (2) opposite a substrate (15). A magnetic pole plate (16) having a non-magnetic carrier plate (17) attached thereto is mounted behind the target (7) on a shaft (28) and can be rotated by means of a motor (29) about an axis substantially orthogonal to the target face (8). Carrier plate (17) has an array of holes (19) each of which can receive a corresponding first bar magnet (20, 21). There are fewer magnets (20, 21) than there are holes (19) and the magnets (20, 21) are removable from their holes (19). Carrier plate (17) also has a circumferential line of holes (22), in each of which may be mounted a corresponding second bar magnet (23). By varying the number and positions of the bar magnets (20, 21, 23) in the holes (19, 22) a variety of different high density plasma zone shapes (24; 25, 26; 27; 28) can be produced upon the target face (8). Conveniently, the bar magnets (20, 21, 23) are round in section but can alternatively be of square or hexagonal section, if desired.

13 Claims, 5 Drawing Sheets

VACUUM SPUTTERING APPARATUS

This invention relates to a vacuum sputtering apparatus.

Vacuum sputtering is a technique whereby very thin films of material can be deposited upon a substrate. The technique involves projecting charged particles, usually positive ions generated in a plasma under near perfect vacuum conditions, at a target so as to eject atoms of the target material therefrom. Typical operating conditions involve use of pressures of at most a few Pa. Such atoms of target material will then deposit upon a substrate at an appropriate potential which is placed in their path and will then build up as a thin layer on the substrate. The technique is widely used in the microelectronics and computer industries for production of semiconductor devices and other thin film devices, for example, magnetic read heads for computer disk drives or integrated circuit devices.

Generation of a plasma is effected by admission of one or more plasma generating gases at a controlled rate to the plasma chamber under high vacuum conditions and then applying d.c. or r.f. power thereto so as to strip electrons off the atoms of gas to form positive ions. When using d.c. power it is expedient to apply a magnetic field within the vacuum chamber so as to trap electrons in the plasma region, thereby to increase the chance of collisions between electrons and neutral atoms of the plasma in the main body of the vacuum chamber and consequent ionisation thereof. This technique is used in the magnetron electrode.

Plasma generation can be carried out using d.c. power and a magnetron electrode so long as the target electrode is electrically conductive. R.f. power can be used, with or without magnetic enchancement, when the target electrode is made of a dielectric material.

Typical gases used for plasma generation include Ar, $O_2$, $Cl_2$, $N_2$, $CO_2$, $SF_6$, $C_2F_6$ or a $C_2F_6/CHF_3$ mixture.

In order to improve the uniformity of the film deposited upon the substrate, particularly when depositing thin films upon a large semiconductor wafer having, for example, a diameter of about 8 inches (about 200 mm), one proposal has been to mount a rotatable magnet device behind the target which is arranged for rotation about an axis substantially orthogonal to the target face of the target electrode. The rotatable magnet device is arranged so that a magnetic field of appropriate configuration extends over the face of the target electrode and sweeps thereover as the magnet device is rotated. In such an arrangement the rotatable magnet means typically comprises a circular, but non-axisymmetric, permanent magnet assembly; upon rotation thereof about its axis, its magnetic field sweeps over the target face and causes the plasma also to sweep thereover with a view to improving the uniformity of the sputtered film and/or the uniformity of target utilisation. However, although the results can be better when using this arrangement than in sputtering apparatus with stationary magnets, the uniformity of the deposited film still leaves something to be desired.

If a magnetic film is to be deposited on a substrate it is necessary to provide a magnetic orienting field in order to impart the desired magnetic properties to the deposited film. Distortion of the plasma can be caused by application of such a magnetic field, leading in turn to production of a non-uniform sputtered film deposit upon the substrate, besides leading to operational problems.

It has been found that the uniformity of the sputtered film is improved by increasing the size of the target with respect to the substrate upon which the sputtered film is to be deposited. it is also improved by reducing the distance between the target and the substrate.

Although the uniformity of sputtering can be improved using such a device, the geometry of the target electrode and its material of construction can affect the uniformity of the magnetic field across the target face. Accordingly it may be necessary to provide a different magnet device for different geometries of, or different materials of construction of, target electrodes.

It would be desirable to improve the uniformity of the thin films deposited upon a substrate by the vacuum sputtering technique. It would further be desirable to enable the operator of a vacuum sputtering apparatus to adjust the magnetic field over the target face of a target electrode in a vacuum sputtering apparatus which utilises a rotatable magnet device so as to influence the uniformity of the plasma in the region of the target electrode within the vacuum chamber. It would also be desirable to improve the uniformity of deposition of vacuum sputtered films upon a substrate using targets of smaller diameter relative to the diameter of the substrate.

it is accordingly an object of the present invention to provide an improved rotatable magnet device for mounting behind a target electrode within a vacuum chamber of a vacuum sputtering apparatus so as to enable an operator of the apparatus to influence the magnetic field in the region of the target face of the target electrode. It is a further object of the present invention to provide an improved form of sputtering apparatus which operates under r.f. or d.c. vacuum sputtering conditions in which the operator can adjust the magnetic field over the target face of the target electrode to suit different geometries and/or properties of the target electrode. A further object of the invention is to improve the uniformity of vacuum sputtered films deposited upon a substrate using a target whose diameter is minimised relative to that of the substrate.

According to one aspect of the present invention there is provided a vacuum sputtering apparatus comprising:

a vacuum chamber;

means for evacuating the vacuum chamber;

means for admitting a plasma forming gas to the vacuum chamber;

a target electrode within the vacuum chamber having a target face from which material is to be sputtered by impact of positive ions thereagainst from a plasma discharge in the vacuum chamber in operation of the vacuum sputtering apparatus;

substrate support means within the vacuum chamber for supporting a substrate having a deposition face upon which material from the target electrode is to be sputtered and being arranged so that the deposition face faces the target electrode;

means for imparting a negative bias to the substrate support means;

power supply means for imparting a negative potential to the target electrode and for establishing a plasma in the vacuum chamber; and rotatable magnet means arranged for rotation about an axis substantially orthogonal to the target face and disposed behind the target electrode on the opposite side of the target electrode from the target face, the rotatable magnet means comprising:

magnetic pole piece means;

substantially non-magnetic carrier means rotatable with the magnetic pole piece means and having a plurality of axially extending holes formed therein arranged in an array over a face of the non-magnetic carrier means;

a first plurality of first removable permanent magnets received each in a corresponding one of the axially extending holes in the non-magnetic carrier means, "said rotatable magnet means having fewer first removable permanent magnets than axially extending holes;" and a second plurality of second permanent magnets disposed on the non-magnetic carrier means in an array surrounding the first plurality of first removable permanent magnets;

whereby the first and second permanent magnets together produce a magnetic field of desired shape and field strength over the target face of the target electrode which sweeps over the target face upon rotation of the rotatable magnet means.

The invention further provides a rotatable magnet means for use in vacuum sputtering for mounting behind a target electrode having a target face from which material is to be sputtered under vacuum sputtering conditions, the rotatable magnet means comprising:

magnetic pole piece means;

substantially non-magnetic carrier means rotatable with the magnetic pole piece means and having a plurality of axially extending holes formed therein arranged in an array over a face of the non-magnetic carrier means;

a first plurality of first removable permanent magnets received each in a corresponding one of the axially extending holes in the non-magnetic carrier means, "said rotatable magnet means having fewer first removable permanent magnets than axially extending holes;" and a second plurality of second permanent magnets disposed on the non-magnetic carrier means in an array surrounding the first plurality of first removable permanent magnets;

whereby the first and second permanent magnets together produce a magnetic field of desired shape and field strength over the target face of the target electrode which sweeps over the target face upon rotation of the rotatable magnet means.

The power supply means may be an r.f. power source. Alternatively it may comprise a d.c. magnetron power source. The means for imparting a negative bias to the substrate support means may be an r.f. power supply source or a d.c. power source.

In use, the first magnets are preferably disposed in the axially extending holes in a pattern which possesses at least one plane of axial symmetry. The first magnets may further be so arranged in the axially extending holes so that at least one, and preferably at least a plurality of them, have a pole of a first polarity (e.g. north) directed towards the target while at least one other, and preferably at least a plurality of others, of them have a pole of a second polarity (e.g. south) directed towards the target.

Preferably all of the second magnets have poles of the first polarity or of the second polarity directed towards the target so that all of them have poles of the same polarity directed towards the target. Conveniently the second magnets are arranged on a substantially circular locus or on a plurality of substantially concentric loci described about the axis of rotation of the pole piece means. In this case the second magnets may be regularly spaced one from another along the locus or along each respective locus.

In one embodiment the first bar magnets and/or the second bar magnets are substantially circular in cross section; alternatively they may be substantially square or hexagonal in cross section.

In order that the invention may be clearly understood and readily carried into effect a preferred embodiment thereof will now be described, by way of example only, with reference to the accompanying drawings, wherein.

Figure 1:
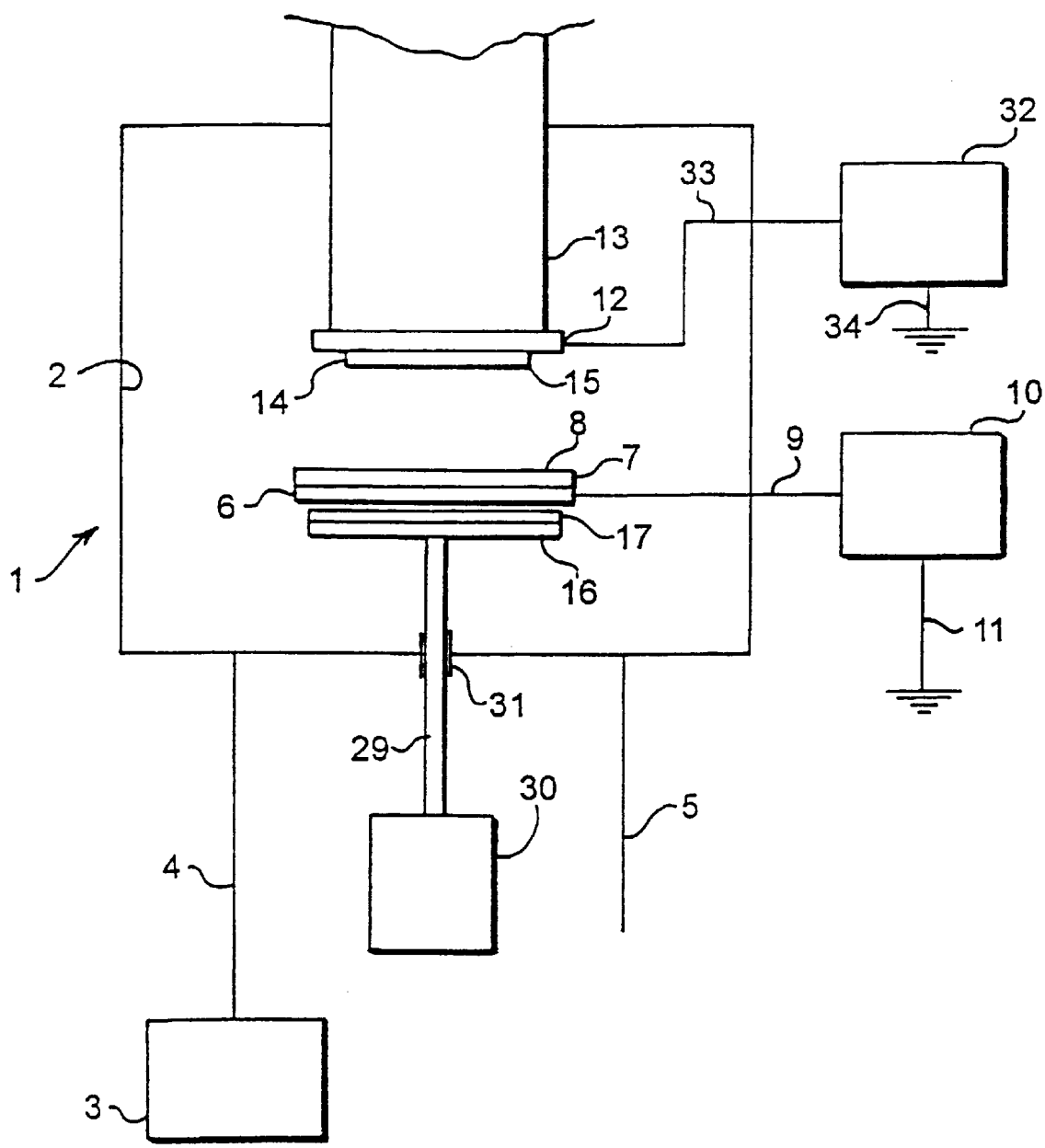
FIG. 1 is a diagram of an r.f. or d.c. operated vacuum sputtering apparatus constructed in accordance with the invention.

Referring to the drawings, FIG. 1 shows diagrammatically an r.f. vacuum sputtering apparatus 1. This apparatus can be substantially inverted without affecting the principle of operation. The apparatus includes a vacuum chamber 2 which can be evacuated by means of vacuum pump 3 via line 4 to a pressure of, for example, from about $10^6$ Pa to about $10^5$ Pa. A plasma forming gas can be admitted to vacuum chamber 2 through gas supply conduit 5 from a suitable source, such as a gas cylinder (not shown). Within vacuum chamber 2 there is mounted a target support table 6 upon which a target 7 made, for example, of gold, can be supported with the target surface 8 from which material is to be sputtered facing upwards. Target support 6 is connected by connected to earth by line 11. In this way a negative bias d.c. potential can be developed on target surface 8. Target 7 may be electrically conductive and in good electrical contact with target support 6; alternatively it may be made from a dielectric material. In this latter case power coupling to the plasma is capacitive.

Also mounted within vacuum chamber 2 is a substrate support table 12 which is carried upon the lower end of column 13. A substrate 14 upon whose underneath face 15 material sputtered from target 7 is to be deposited is mounted to the underside of substrate support table 12. Typically substrate 14 is a semiconductor wafer or ceramic substrate having a diameter of, for example, about 8 inches (200 mm).

Figure 2:
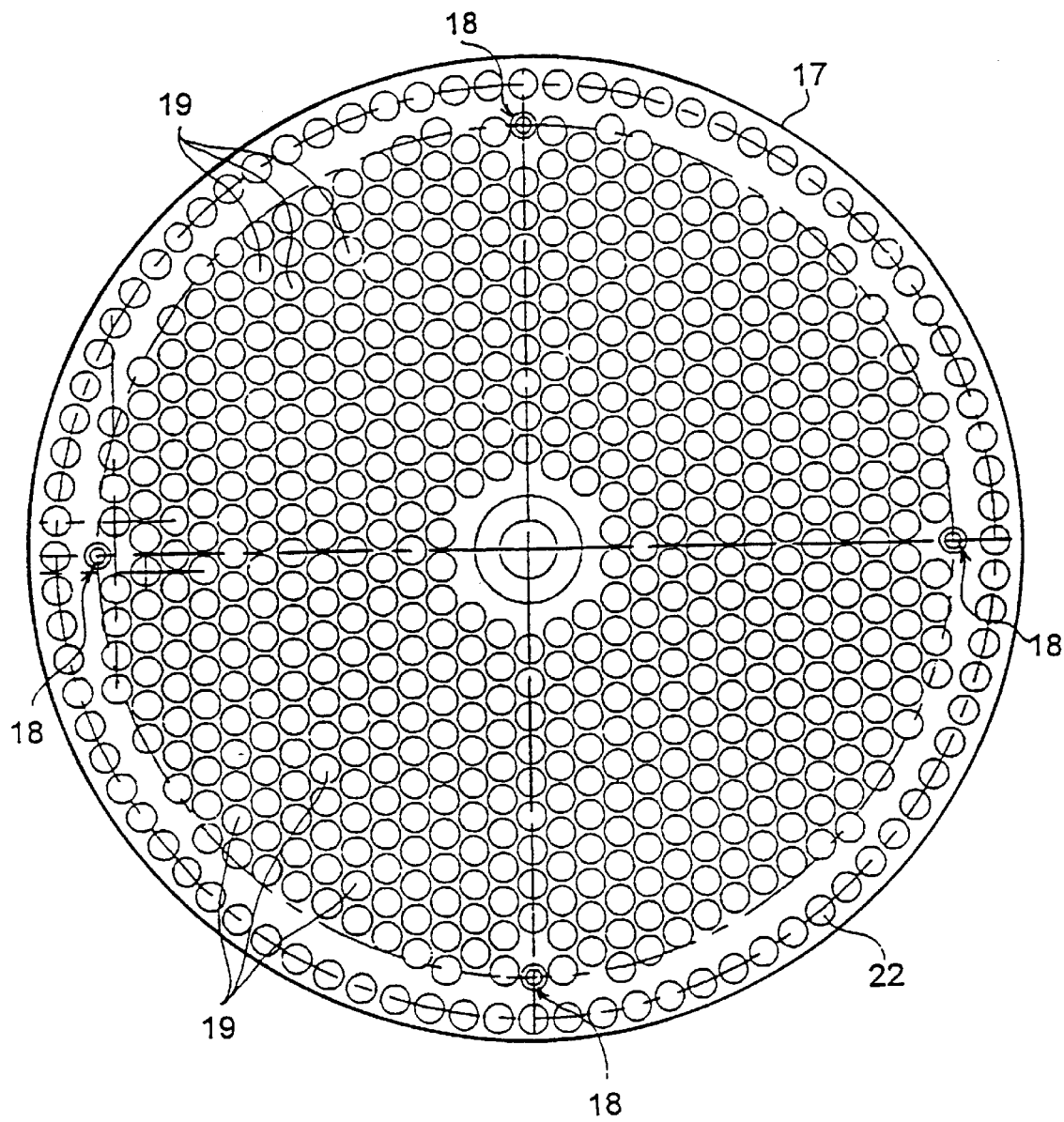
FIG. 2 is a top plan view of a non-magnetic carrier plate forming part of the sputtering apparatus of FIG. 1.
Figure 3:
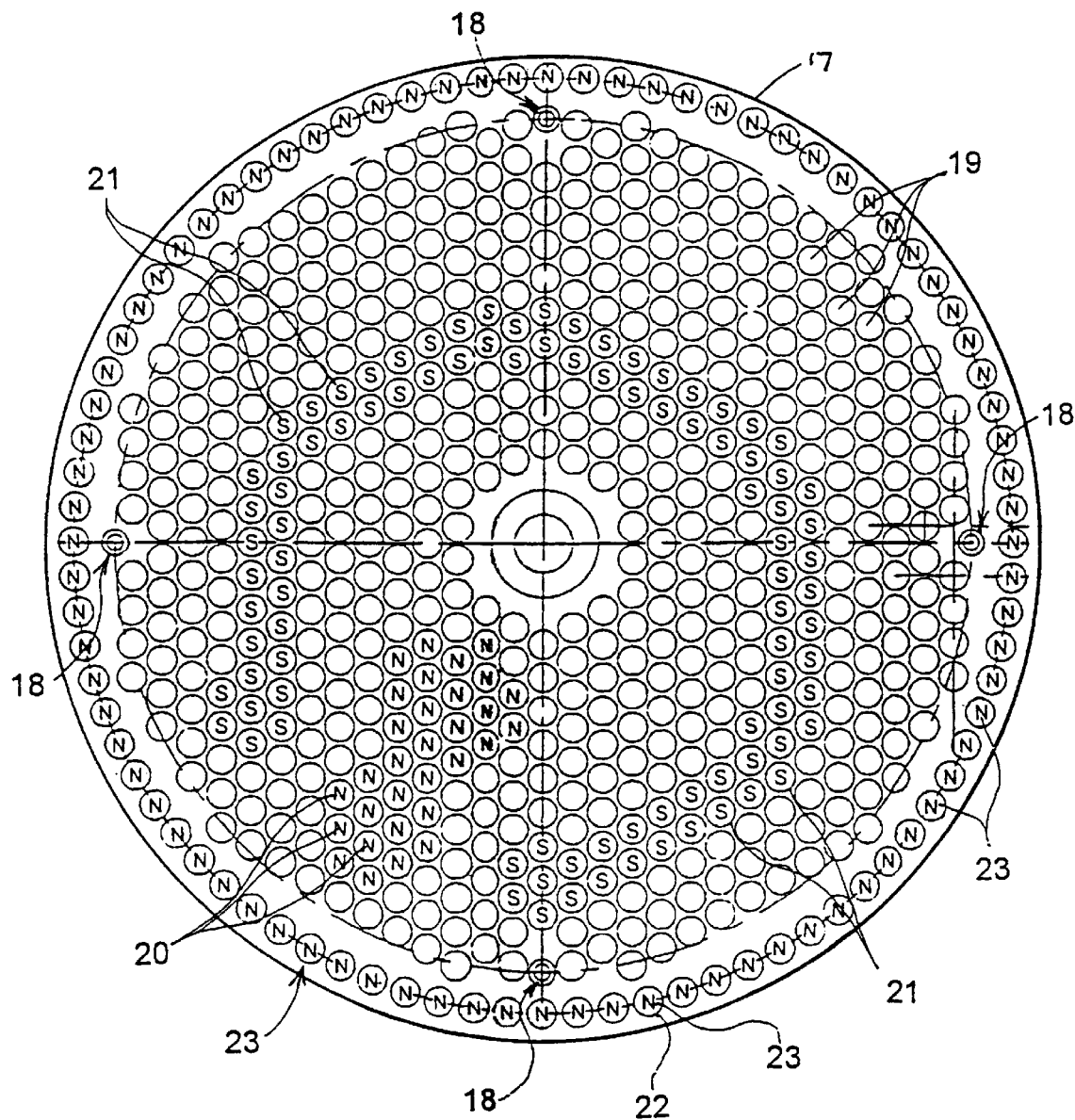
FIG. 3 is a corresponding top plan view of the non-magnetic carrier plate of FIG. 2 after insertion of a number of permanent magnets in a magnet array pattern.

Beneath target support 6 there is a rotatable circular magnetic pole plate 16 made of a magnetisable material such as soft iron. On top of this there is fixed a non-magnetic carrier plate 17 made, for example, from aluminum. As can be seen from FIG. 2, carrier plate 17 is provided with four holes 18, spaced 90° one from another about the axis of rotation of carrier plate 17, for passage of screws (not shown) for attachment of carrier plate 17 to the magnetic pole plate 16. It also has a plurality of holes 19 arranged in a hexagonal closed packed array, each of which can receive a corresponding first bar magnet 20 or 21 (see FIG. 3). These can be arranged either with their north poles uppermost, i.e. magnets 20, or with their south poles uppermost, i.e. magnets 21, as illustrated in FIG. 3. Preferably the first bar magnets 20, 21 are arranged in the holes 19 such that there is at least one axial plane of symmetry in the arrangement of first bar magnets 20, 21. Carrier plate is also provided with a circumferential line of holes 22, in each of which (as can be seen from FIG. 3) holes 22, in each of which (as can be seen from FIG. 3) there is received a corresponding second bar magnet 23 so that there is a fully populated single ring of magnets 23. In the arrangement shown in FIG. 3 the second bar magnets 23 are arranged with their north poles facing upwards.

If desired, carrier plate 17 can be of larger diameter and a further ring or rings of holes formed in it for receipt of a further set or sets of magnets corresponding to magnets 23.

Figure 4:
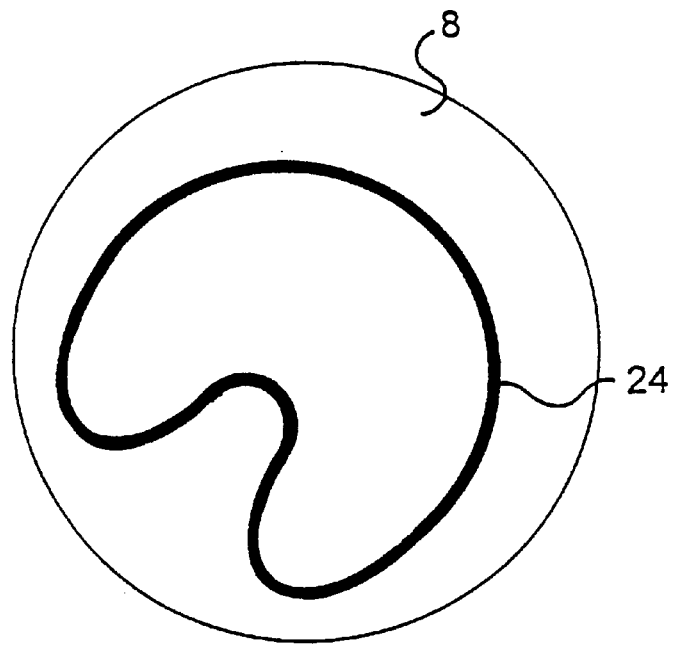
FIG. 4 is a top plan view of the target electrode of the sputtering apparatus of FIG. 1 showing the shape of the high density plasma locus produced by the magnet array pattern of FIG. 3.

FIG. 4 illustrates the high density plasma (in this case a "magnetron ring" zone) shape 24 produced over the target face 8 of the target 7 using the arrangement of magnets 20, 21 and 23 on the carrier plate 17 shown in FIG. 3.

Figure 5:
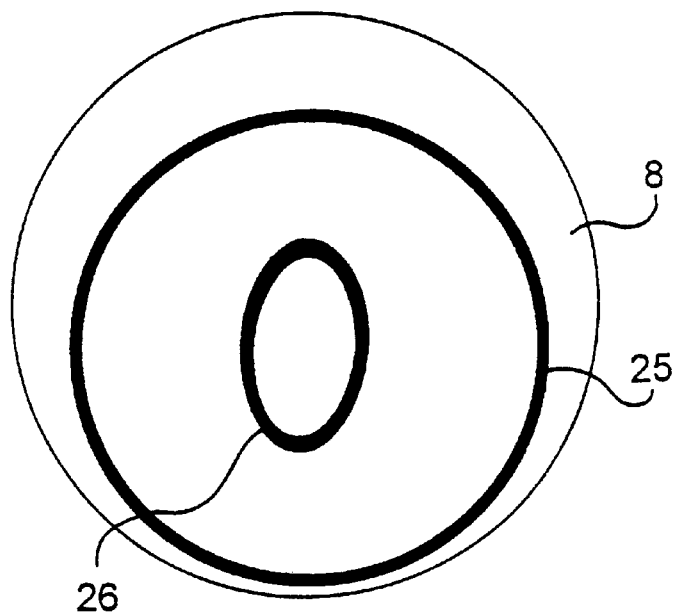
FIGS. 5 to 7 are views similar to that of FIG. 4 showing other shapes of high density plasma locus or loci obtainable by rearranging the magnets of FIG. 3 in other patterns.
Figure 6:
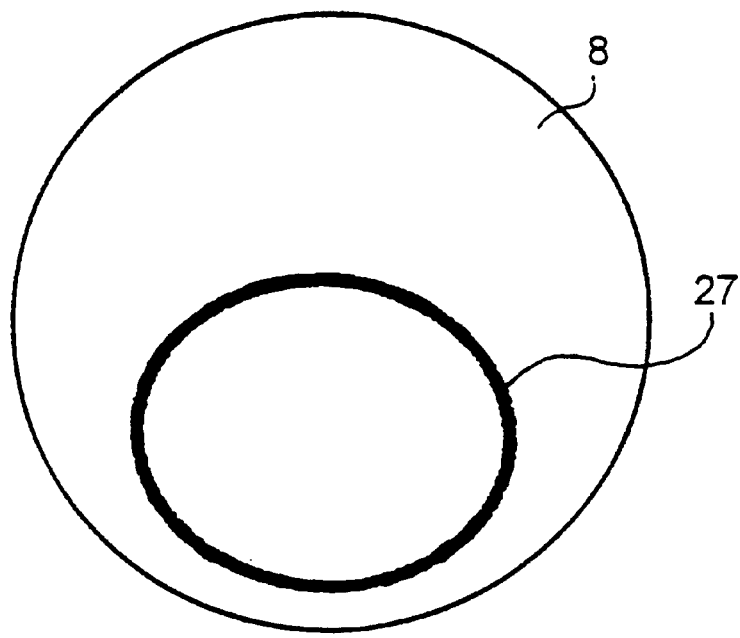
Figure 7:
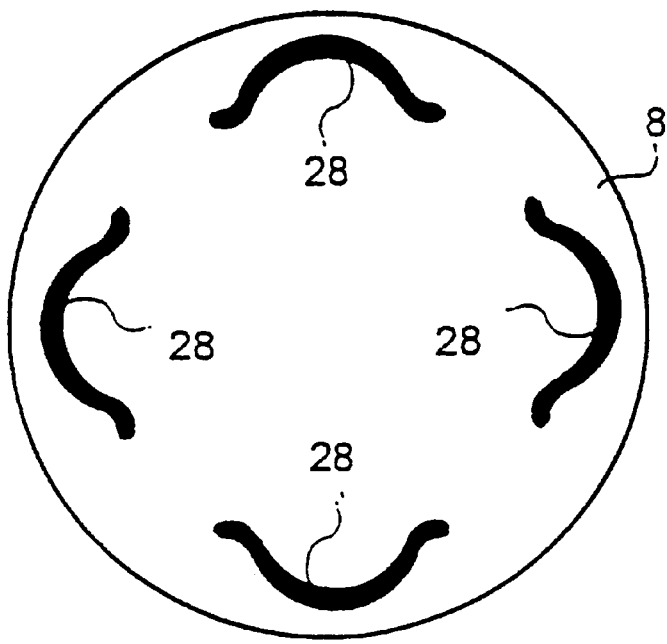

It will be apparent to those skilled in the art that, by positioning the replaceable bar magnets 20 and 21 in other holes 20, by increasing or decreasing their number, a variety of different high density plasma zone shapes can be produced. Examples of other such high density plasma zone shapes are provided by zone shapes 25 and 26 in FIG. 5, by zone shape 27 in FIG. 6, and by the combination of shapes 28 illustrated in FIG. 7.

Returning to FIG. 1, it will be seen that magnetic pole plate 16 and carrier plate 17 are carried on a vertical shaft 29 which can be rotated by means of motor 30. Reference numeral 31 indicates a shaft seal while reference numeral 32 indicates a further r.f. power supply means, which is connected by line 33 to substrate support table 12 and by line 34 to earth, for imparting a negative bias to substrate support table 12 and hence to the substrate 14.

Although the illustrated bar magnets 20, 21 and 23 are of round section, other shapes of magnet are possible, for example bar magnets of square or hexagonal section. In this case the holes 19 and/or 22 would be of corresponding cross section.

In operation of the apparatus illustrated in FIG. 1, the vacuum chamber 2 is evacuated to a pressure of, for example, from about $10^5$ Pa to about $10^6$ Pa and a plasma forming gas is bled in via line 5 to a pressure in the region of 1 Pa. Motor 29 is then switched on so that magnetic pole plate 16 and carrier plate 17 are rotated at a speed of from about 10 rpm to about 100 rpm. This causes the magnetic field produced by bar magnets 20, 21 and 23 to sweep over the target face 8 of target 7. Upon supplying r.f. power at a frequency of, for example 13.56 MHz, a negative potential bias is imparted to the target 7 and a glow discharge plasma is produced in the gas in plasma chamber 2. Ions from the plasma are attracted to the target face 8 and cause sputtering of material of the target 7 upon impact therewith. Such sputtered material can deposit upon the substrate 15 and form a uniform film thereon.

In the arrangement shown in FIG. 3 the bar magnets 20, 21 and 23 are effectively arranged on and magnetically coupled with the magnetic pole plate 16 so as to produce a magnetic field having a predetermined three dimensional topology such that the locus of points in a space from 3 to 12 mm in front of the target face 8 where the lines of magnetic flux are substantially parallel to the plane of target face 8 describes an appropriate two dimensional topological form designed to generate high density regions of plasma which, upon rotation of the magnetic pole plate 16 and carrier plate 17 with supported magnets 20, 21 and 23 behind the target 7, produce an axisymmetric sputtering profile of the target material calculated to yield a film of uniform thickness on the substrate 15 at a given distance from the target surface 8 and to achieve an optimum utilisation of the Using apparatus constructed in accordance with the invention it is possible to produce sputtered thin films of excellent uniformity of thickness. Moreover it is possible to achieve very good utilisation of target material using either d.c. magnetron or r.f. sputtering methods. It is possible to "tune" the target erosion profile readily for target materials having widely differing properties, for example metallic or non-metallic materials, magnetic or non-magnetic materials, as well as targets of differing thicknesses. This flexibility can be achieved by the use of a variable layout of the bar magnets 20, 21 and 23 on the magnetic pole plate 16 and/or by using bar magnets of different strengths.

What is claimed is:

1. A vacuum sputtering apparatus comprising:
   a vacuum chamber;
   means for evacuating the vacuum chamber;
   means for admitting a plasma forming gas to the vacuum chamber;
   a target electrode within the vacuum chamber having a target face from which material is to be sputtered by impact of positive ions thereagainst from a plasma discharge in the vacuum chamber in operation of the vacuum sputtering device;
   substrate support means within the vacuum chamber for supporting a substrate having a deposition face upon which material from the target electrode is to be sputtered and being arranged so that the deposition face faces the target electrode;
   means for imparting a negative bias to the substrate support means;
   power supply means for imparting a negative potential to the target electrode and for establishing a plasma in the vacuum chamber; and
   rotatable magnet means arranged for rotation about an axis substantially orthogonal to the target face and disposed behind the target electrode on the opposite side of the target electrode from the target face, the rotatable magnet means comprising:
   magnetic pole piece means;
   substantially non-magnetic carrier means rotatable with the magnetic pole piece means and having a plurality of axially extending holes formed therein arranged in an array over a face of the non-magnetic carrier means;
   a first plurality of first removable permanent magnets received each in a corresponding one of the axially extending holes in the non-magnetic carrier means, "said rotatable magnet means having fewer first removable permanent magnets than axially extending holes;" and
   a second plurality of second permanent magnets disposed on the non-magnetic carrier means in an array surrounding the first plurality of first removable permanent magnets;
   whereby the first and second permanent magnets together produce a magnetic field of desired shape and field strength over the target face of the target electrode which sweeps over the target face upon rotation of the rotatable magnet means.

2. A vacuum sputtering apparatus according to claim 1, wherein the power supply means and the means for imparting a negative bias to the substrate support means is in each case an r.f. power source.

3. A vacuum sputtering apparatus according to claim 1, wherein the power supply means and the means for imparting a negative bias to the substrate support means is in each case a d.c. magnetron power source.

4. A vacuum sputtering apparatus according to claim 1, wherein the first magnets are disposed in the axially extending holes in a pattern which possesses at least one plane of axial symmetry.

5. A vacuum sputtering apparatus according to claim 4, wherein the first magnets are so arranged in the axially extending holes that at least a plurality of them have a north pole directed towards the target while at least a plurality of others of them have a south pole directed towards the target.

6. A vacuum sputtering apparatus according to claim 1, wherein either all of the second magnets have north poles directed towards the target or all of the second magnets have south poles directed towards the target.

7. A vacuum sputtering apparatus according to claim 1, wherein the second magnets are arranged on a substantially circular locus described about the axis of rotation of the pole piece means.

8. A vacuum sputtering apparatus according to claim 7, wherein the second magnets are regularly spaced one from another along the substantially circular locus.

9. A vacuum sputtering apparatus according to claim 1, wherein the first magnets are each of substantially circular cross section.

10. A vacuum sputtering apparatus according to claim 1, wherein the second magnets are each of substantially circular cross section.

11. A rotatable magnet means for use in vacuum sputtering for mounting behind a target electrode having a target face from which material is to be sputtered under vacuum sputtering conditions, the rotatable magnet means comprising:

magnetic pole piece means;

substantially non-magnetic carrier means rotatable with the magnetic pole piece means and having a plurality of axially extending holes formed therein arranged in an array over a face of the non-magnetic carrier means;

a first plurality of first removable permanent magnets received each in a corresponding one of the axially extending holes in the non-magnetic carrier means, "said rotatable magnet means having fewer first removable permanent magnets than axially extending holes;" and a second plurality of second permanent magnets disposed on the non-magnetic carrier means in an array surrounding the first plurality of first removable permanent magnets;

whereby the first and second permanent magnets together produce a magnetic field of desired shape and field strength over the target face of the target electrode which sweeps over the target face upon rotation of the rotatable magnet means.

12. A vacuum sputtering apparatus comprising:

a vacuum chamber;

a vacuum pump for evacuating the vacuum chamber;

a gas supply conduit for admitting a plasma forming gas to the vacuum chamber;

a target electrode within the vacuum chamber, said target electrode having a target face from which material is to be sputtered by impact of positive ions thereagainst from a plasma discharge in the vacuum chamber in operation of the vacuum sputtering device;

a negatively biased substrate support table within the vacuum chamber for supporting a substrate, said substrate having a deposition face upon which material from the target electrode is to be sputtered and being arranged so that the deposition face faces the target electrode;

a power supply for imparting a negative potential to the target electrode and for establishing a plasma in the vacuum chamber;

a magnetic pole piece arranged for rotation about an axis substantially orthogonal to the target face and disposed behind the target electrode on the opposite side of the target electrode from the target face;

a substantially non-magnetic carrier rotatable with the magnetic pole piece, said non-magnetic carrier having a plurality of axially extending holes formed therein arranged in an array over a face of the non-magnetic carrier;

a first plurality of first removable permanent magnets received each in a corresponding one of the axially extending holes in the non-magnetic carrier, "said vacuum sputtering apparatus having fewer first removable permanent magnets than axially extending holes;" and a second plurality of second permanent magnets disposed on the non-magnetic carrier in an array surrounding the first plurality of first removable permanent magnets, said first and second permanent magnets together producing a magnetic field of desired shape and field strength over the target face of the target electrode which sweeps over the target face upon rotation of the rotatable magnetic pole piece and non-magnetic carrier.

13. A rotatable magnet apparatus for use in vacuum sputtering for mounting behind a target electrode having a target face from which material is to be sputtered under vacuum sputtering conditions, said apparatus comprising:

a magnetic pole piece;

a substantially non-magnetic carrier rotatable with the magnetic pole piece, said non-magnetic carrier having a plurality of axially extending holes formed therein arranged in an array over a face of the non-magnetic carrier;

a first plurality of first removable permanent magnets received each in a corresponding one of the axially extending holes in the non-magnetic carrier, "said rotatable magnet apparatus having fewer first removable permanent magnets than axially extending holes;" and a second plurality of second permanent magnets disposed on the non-magnetic carrier in an array surrounding the first plurality of first removable permanent magnets, said first and second permanent magnets together producing a magnetic field of desired shape and field strength over the target face of the target electrode which sweeps over the target face upon rotation of the rotatable magnetic pole piece and non-magnetic carrier.

* * * * *